(12) United States Patent
Takeuchi et al.

(10) Patent No.: US 6,483,756 B2
(45) Date of Patent: Nov. 19, 2002

(54) SEQUENCE CIRCUIT AND SEMICONDUCTOR DEVICE USING SEQUENCE CIRCUIT

(75) Inventors: Atsushi Takeuchi, Kawasaki (JP); Masaharu Wada, Yokohama (JP)

(73) Assignees: Fujitsu Limited, Kawasaki (JP); Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 09/984,270

(22) Filed: Oct. 29, 2001

(65) Prior Publication Data

US 2002/0054517 A1 May 9, 2002

(30) Foreign Application Priority Data

Nov. 6, 2000 (JP) ........................................ 2000-338068

(51) Int. Cl.⁷ ............................................... G11C 16/04
(52) U.S. Cl. ................................................. 365/189.06
(58) Field of Search ...................... 365/189.06, 189.09, 365/189.11, 149, 226

(56) References Cited

U.S. PATENT DOCUMENTS 5,864,507 A * 1/1999 Hawkins et al. ....... 365/189.06

\* cited by examiner

*Primary Examiner*—David Nelms
*Assistant Examiner*—David Lam
(74) *Attorney, Agent, or Firm*—Arent Fox Kintner Plotkin & Kahn, PLLC

(57) ABSTRACT

A semiconductor device includes a word line that is reset to a negative voltage when the word line is unselected. The semiconductor device further includes a sequence circuit that clamps the word line to a first fixed voltage, until a fixed power-supply voltage that is supplied to a memory cell connected to the word line reaches a second fixed voltage, at a time of starting power supply. Thus, the semiconductor device can prevent a negative power-supply voltage used for resetting the word line from rising, and can reduce consumed energy.

7 Claims, 10 Drawing Sheets

SEQUENCE CIRCUIT AND SEMICONDUCTOR DEVICE USING SEQUENCE CIRCUIT

BACKGROUND OF THE INVENTION

1. Field of the Invention

The present invention relates to a sequence circuit and a semiconductor device. More particularly, the present invention relates to a sequence circuit controlling start up of a power-supply circuit, and a semiconductor device using the sequence circuit.

2. Description of the Related Art

A semiconductor device using a layer-built cell capacitor and a negative word-line resetting system generates a plurality of power sources from an internal step-down power source, and uses the plurality of power sources, for example. A sequence circuit shown in FIG. 1 controls start up of a power-supply circuit generating the plurality of power sources from the internal step-down power source.

FIG. 1 shows an example of a structure of a sequence circuit 1 controlling start up of a power-supply circuit. The sequence circuit 1 shown in FIG. 1 controls start up of a power-supply circuit including a Vbl/Vcp generating unit 11 and a Vnn generating unit 12, and includes a Vii voltage-detecting unit 10 and a sequencer 13.

The Vbl/Vcp generating unit 11 generates a bit-line power-supply voltage Vbl and a cell-plate power-supply voltage Vcp. The Vnn generating unit 12 generates a negative power-supply voltage Vnn. The Vii voltage-detecting unit 10 detects an internal step-down power-supply voltage Vii. Additionally, the sequencer 13 controls a start-up order of a power-supply-voltage-generating unit such as the Vnn generating unit 12. The sequencer 13 includes a plurality of sequencers 13-1, 13-2 and so on, in accordance with the number of the power-supply-voltage-generating units whose start-up orders are controlled.

The sequencer 13 is reset initially at start up. The Vii voltage-detecting unit 10 detects the internal step-down power-supply voltage Vii, and supplies a signal "Vii_ok" to the sequencer 13-1 if the voltage Vii rises to a fixed voltage. The sequencer 13-1 supplies a signal "act" to the Vbl/Vcp generating unit 11 and the Vnn generating unit 12 if the signal Vii_ok is supplied from the Vii voltage-detecting unit 10.

The Vbl/Vcp generating unit 11 starts generating the bit-line power-supply voltage Vbl and the cell-plate power-supply voltage Vcp, if the signal "act" is supplied from the sequencer 13-1. Additionally, the Vnn generating unit 12 starts generating the negative power-supply voltage Vnn, if the signal "act" is supplied from the sequencer 13-1. The Vnn generating unit 12 supplies a signal "Vnn_ok" to the sequencer 13-1, if the negative power-supply voltage Vnn rises to a fixed voltage. If the signal "Vnn_ok" is supplied from the Vnn generating unit 12, the sequencer 13-1 supplies a signal "Sq.1_ok" to the sequencer 13-2.

As described above, a related-art sequence circuit operates the Vbl/Vcp generating unit 11 and the Vnn generating unit 12 concurrently.

FIG. 2 is a circuit diagram showing an example of capacity coupling among a word line, a bit line and a cell plate. In a layer-built cell capacitor shown in FIG. 2, a word line WL is coupled with a bit line BL and a cell plate CP with a large capacity. The negative word-line resetting system resetting a word line to a negative voltage while being inactive needs the negative power-supply voltage Vnn.

Strong capacity coupling is performed among the word line WL, the bit line BL and the cell plate CP, since voltages of the word line WL, the bit line BL and the cell plate CP are set to the negative power-supply voltage Vnn, the bit-line power-supply voltage Vbl and the cell-plate power-supply voltage Vcp, respectively, at start up.

FIG. 3 is a diagram showing an example of voltage changes of the negative power-supply voltage Vnn, the bit-line power-supply voltage Vbl and the cell-plate power-supply voltage Vcp at a time of starting up a power source. As shown in FIG. 3, if the bit-line power-supply voltage Vbl and the cell-plate power-supply voltage Vcp rise at the time of starting up the power source, the negative power-supply voltage Vnn is raised for a certain period even if the Vnn generating unit 12 is operating. Accordingly, the Vnn generating unit 12 needs to lower the negative power-supply voltage Vnn raised as described above, and, thus, a start-up time is extended.

Further, an increase in the negative power-supply voltage Vnn has a possibility to cause a through current shown in FIG. 4, latch up and the like. FIG. 4 is a circuit diagram showing an example of a word-line driving circuit. The negative word-line resetting system lowers a voltage of a sub word line to the negative power-supply voltage Vnn, after lowering the voltage of the sub word line to a ground voltage Vss.

An NMOS (Negative Metal-Oxide Semiconductor) transistor 15 shown in FIG. 4 is a driver that lowers the voltage of the sub word line to the ground voltage Vss at the time of starting up the power source. A gate, a source and a drain of the NMOS transistor 15 are connected to the negative power-supply voltage Vnn, the ground voltage Vss and the internal step-down power-supply voltage Vii, respectively. A through current is generated from the internal step-down power-supply voltage Vii to the ground voltage Vss because of a rise in the negative power-supply voltage Vnn. For example, tens of milliamperes (mA) of a through current is generated in an entire 128M-bit chip.

SUMMARY OF THE INVENTION

Accordingly, it is a general object of the present invention to provide a sequence circuit and a semiconductor device employing the sequence circuit. A more particular object of the present invention is to provide a sequence circuit that can reduce a consumed current by avoiding a rise in a negative power-supply voltage used for resetting a word line at a time of starting up a power source, and a semiconductor device employing the sequence circuit.

The above-described object of the present invention is achieved by a sequence circuit that controls a start-up order of a power-supply circuit, including a first circuit that detects a first power-supply voltage charging a capacitor of a memory cell or a bit line; a second circuit that clamps a second power-supply voltage resetting a word line, to a first fixed voltage, until the first power-supply voltage reaches a second fixed voltage; and a third circuit that cancels clamping the second power-supply voltage after the first power-supply voltage reaches the second fixed voltage, and, then, generates the second power-supply voltage.

The above-described object of the present invention is also achieved by a semiconductor device, including a word line that is reset to a negative voltage when the word line is unselected; and a sequence circuit that clamps the word line to a first fixed voltage until a fixed power-supply voltage supplied to a memory cell reaches a second fixed voltage, at a time of starting up power supply.

Since the sequence circuit clamps the word line to the first fixed voltage such as a ground-level voltage, until the fixed power-supply voltage supplied to the memory cell reaches the second fixed voltage, at the time of starting up the power supply, the semiconductor device can prevent a negative power-supply voltage used for resetting the word line from rising. Consequently, the semiconductor device can reduce consumed energy.

Other objects, features and advantages of the present invention will become more apparent from the following detailed description when read in conjunction with the accompanying drawings.

DESCRIPTION OF THE PREFERRED EMBODIMENTS

A description will now be given of preferred embodiments of the present invention, with reference to the accompanying drawings.

Figure 1:
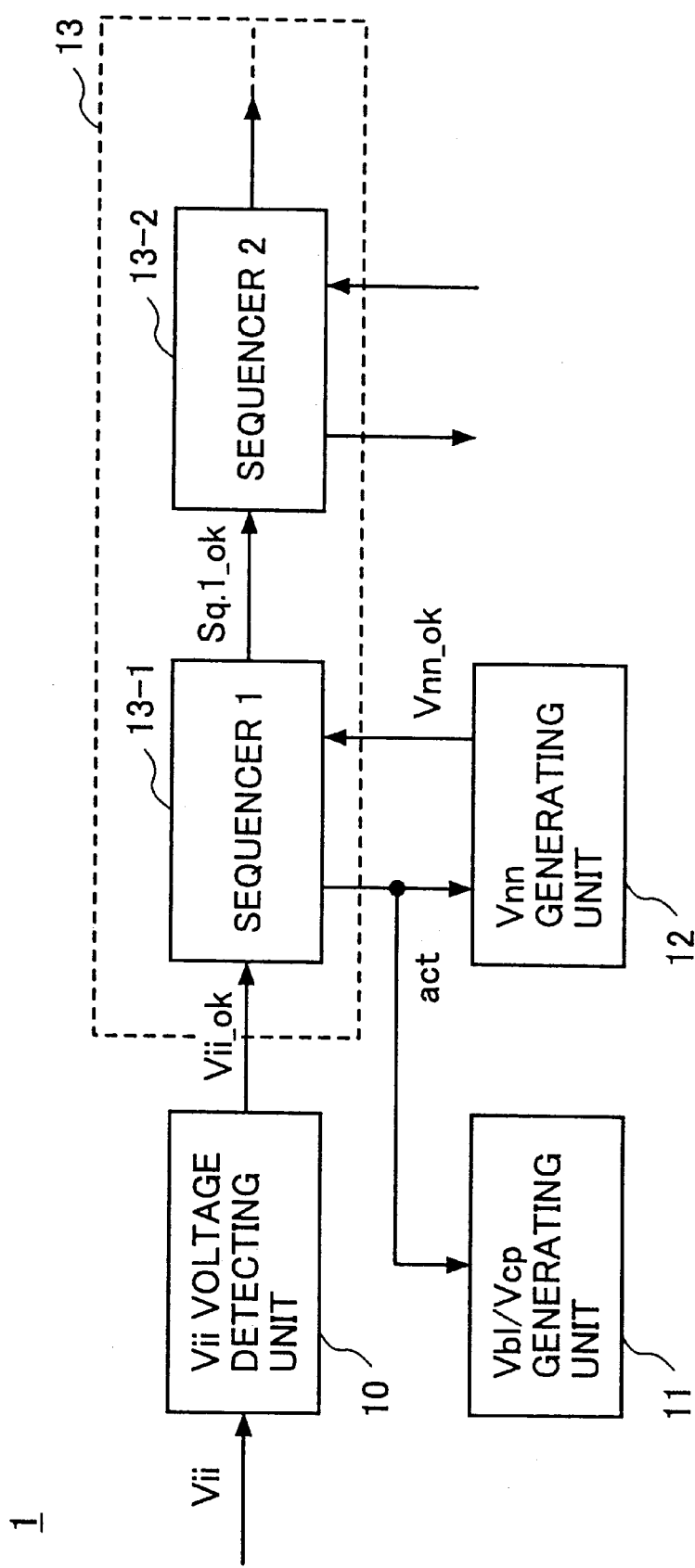
FIG. 1 is a block diagram showing an example of a structure of a sequence circuit controlling start up of a power-supply circuit.
Figure 2:
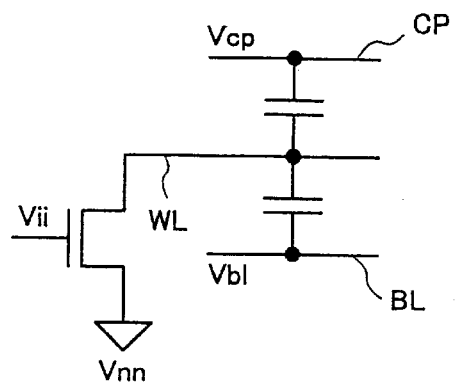
FIG. 2 is a circuit diagram showing an example of capacity coupling among a word line, a bit line and a cell plate.
Figure 3:
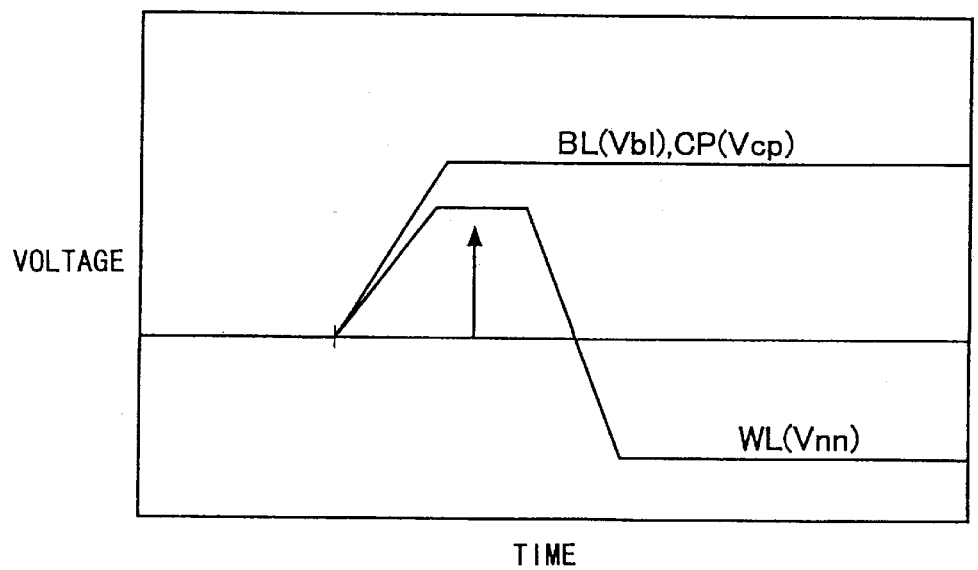
FIG. 3 is a diagram showing an example of voltage changes of a negative power-supply voltage, a bit-line power-supply voltage and a cell-plate power-supply voltage, at a time of starting up a power source.
Figure 4:
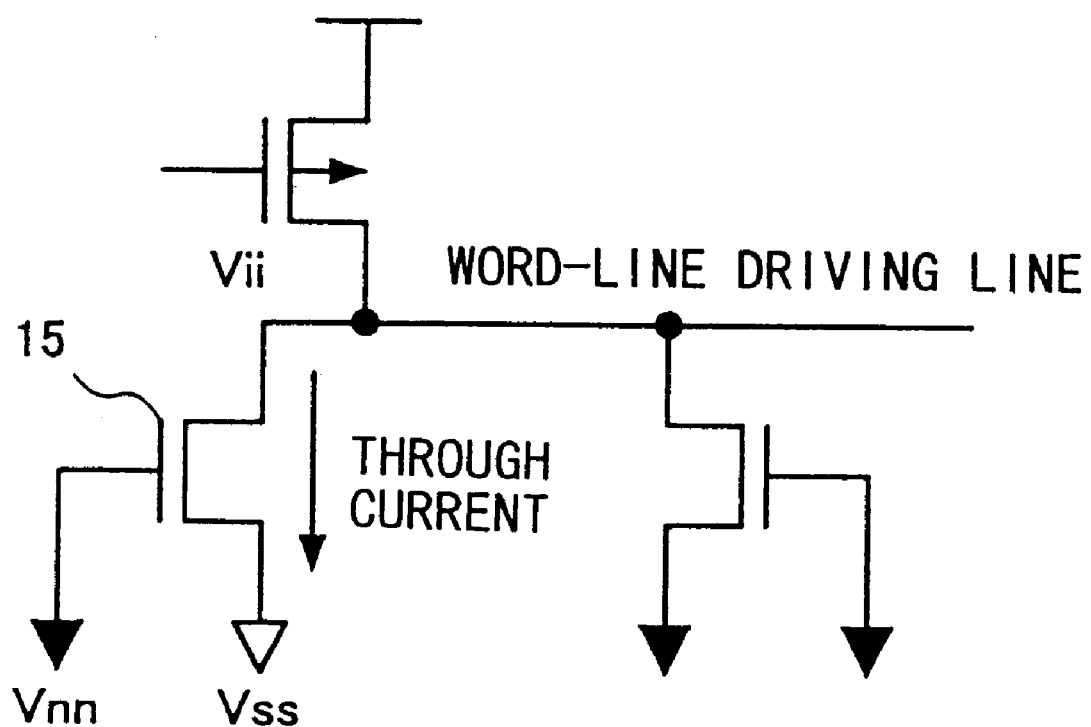
FIG. 4 is a circuit diagram showing an example of a word-line driving circuit.
Figure 5:
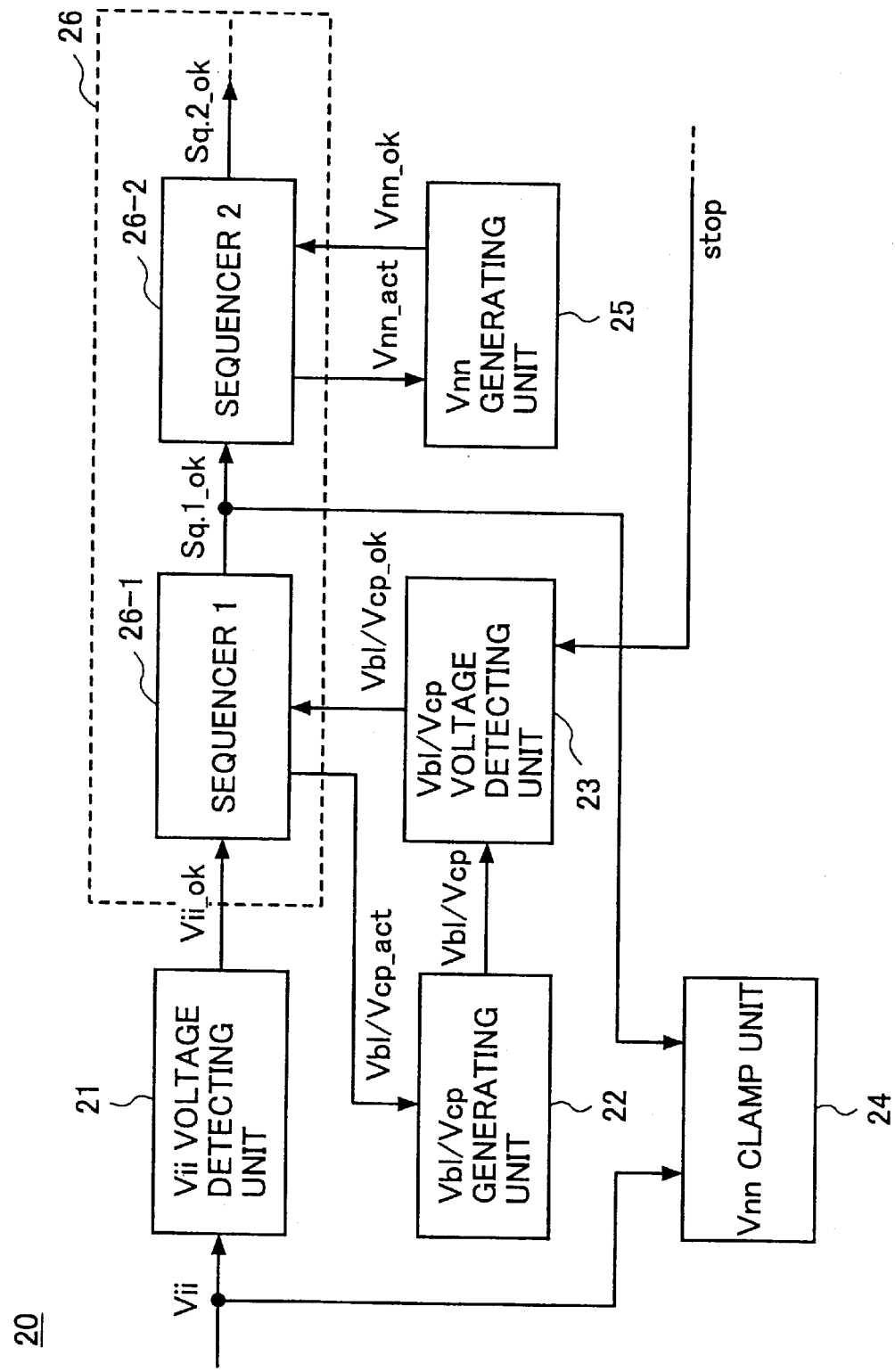
FIG. 5 is a block diagram showing a structure of a sequence circuit according to a first embodiment of the present invention.

FIG. 5 is a block diagram showing a structure of a sequence circuit according to a first embodiment of the present invention. A sequence circuit 20 shown in FIG. 5 controls a start-up order of a power-supply circuit having a Vbl/Vcp generating unit 22 and a Vnn generating unit 25. The Vbl/VCP generating unit 22 generates a bit-line power-supply voltage Vbl and a cell-plate power-supply voltage Vcp. The Vnn generating unit 25 generates a negative power-supply voltage Vnn.

The sequence circuit 20 includes a Vii voltage-detecting unit 21, a Vbl/Vcp voltage-detecting unit 23, a Vnn clamp unit 24 and a sequencer 26. The Vii voltage-detecting unit 21 detects an internal step-down power-supply voltage Vii. The Vbl/Vcp voltage-detecting unit 23 detects the bit-line power-supply voltage Vbl and the cell-plate power-supply voltage Vcp. The Vnn clamp unit 24 clamps the negative power-supply voltage Vnn to a ground voltage Vss. Additionally, the sequencer 26 controls a start-up order of power-supply voltage-generating units such as the Vbl/Vcp generating unit 22 and the Vnn generating unit 25. The sequencer 26 includes one or a plurality of sequencers 26-1, 26-2 and so on, in accordance with the number of the power-supply voltage-generating units that controls the start-up order.

A description will now be given of an operation of the sequence circuit 20 shown in FIG. 5, with reference to timing diagrams shown in FIGS. 6A through 6K. FIGS. 6A through 6K are timing diagrams about the sequence circuit 20 according to the present invention.

Figure 6:
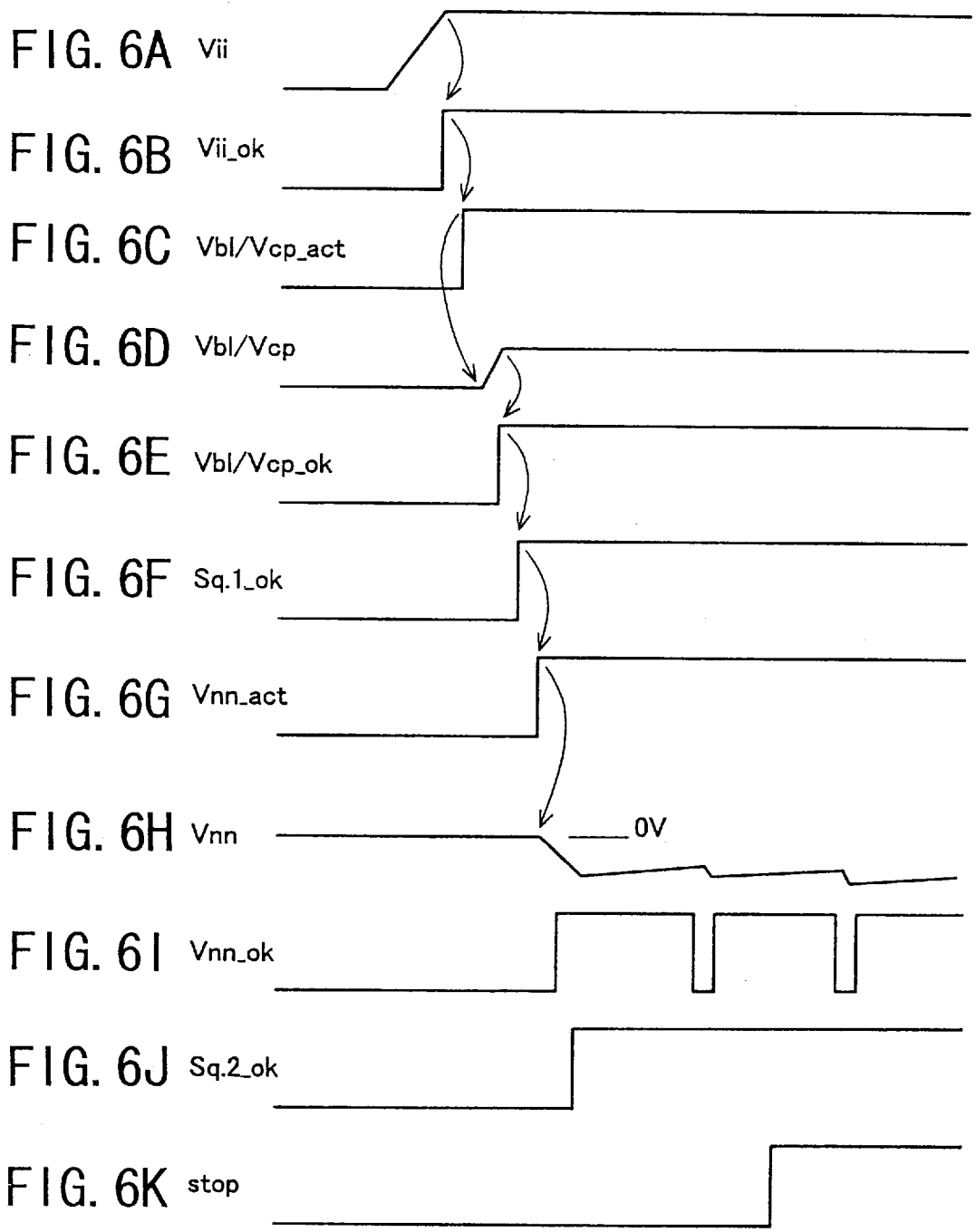
FIGS. 6A through 6K are timing diagrams about the sequence circuit, according to the present invention.

The Vii voltage-detecting unit 21 and the Vnn clamp unit 24 are supplied with the internal step-down power-supply voltage Vii shown in FIG. 6A. The Vii voltage-detecting unit 21 detects the internal step-down power-supply voltage Vii. If the internal step-down power-supply voltage Vii rises to a fixed voltage, the Vii voltage-detecting unit 21 supplies a signal "vii_ok" set high as shown in FIG. 6B, to the sequencer 26-1.

The sequencer 26-1 supplies a signal "Vbl/Vcp_act" set high as shown in FIG. 6C to the Vbl/Vcp generating unit 22, if the signal "Vii_ok" set high is supplied. The Vbl/Vcp generating unit 22 starts generating the bit-line power-supply voltage Vbl and the cell-plate power-supply voltage Vcp shown in FIG. 6D, if the signal "Vbl/Vcp_act" set high is supplied. Additionally, the Vbl/Vcp generating unit 22 supplies the generated bit-line power-supply voltage Vbl and cell-plate power-supply voltage Vcp to the Vbl/Vcp voltage-detecting unit 23.

The Vbl/Vcp voltage-detecting unit 23 detects the bit-line power-supply voltage Vbl and the cell-plate power-supply voltage Vcp. If the bit-line power-supply voltage Vbl and the cell-plate power-supply voltage Vcp rise to a fixed voltage, the Vbl/Vcp voltage-detecting unit 23 supplies a signal "Vbl/Vcp_ok" set high as shown in FIG. 6E to the sequencer 26-1. If the signal "Vbl/Vcp_ok" set high is supplied to the sequencer 26-1, the sequencer 26-1 supplies a signal "Sq.1_ok" set high as shown in FIG. 6F to the sequencer 26-2 and the Vnn clamp unit 24.

The sequencer 26-2 supplies a signal "Vnn_act" set high as shown in FIG. 6G to the Vnn generating unit 25, if the signal "Sq.1_ok" set high is supplied. The Vnn generating unit 25 starts generating the negative power-supply voltage Vnn shown in FIG. 6H, if the signal "Vnn_act" set high is supplied.

The Vnn clamp unit 24 clamps the negative power-supply voltage Vnn to the ground voltage Vss, as shown in FIG. 6H, until the signal "Sq.1_ok" set high is supplied. If the signal "Sq.1_ok" set high is supplied, the Vnn clamp unit 24 decides that the bit-line power-supplyyvoltage Vbl and the cell-plate power-supply voltage Vcp have risen to the fixed voltage, and stops a clamping operation.

The Vnn generating unit 25 lowers the negative power-supply voltage Vnn to a fixed voltage, as shown in FIG. 6H, and, then, supplies a signal "Vnn-ok" set high as shown in FIG. 6I to the sequencer 26-2. If the signal "Vnn_ok" set high is supplied, the sequencer 26-2 supplied a signal "Sq.2_ok" set high as shown in FIG. 6J to the latter sequencer. When all the units are powered on according to the above-described steps, the Vbl/Vcp voltage-detecting unit 23 is supplied with a signal "stop" set high as shown in FIG. 6K, and stops a Vbl/Vcp voltage detecting operation.

Accordingly, the present invention can achieve reduction of consumed electricity, by stopping the Vbl/Vcp voltage detecting operation carried out by the Vbl/Vcp voltage-detecting unit 23 after all the units are powered on.

As described above, the sequence circuit 20 according to the present invention clamps the negative power-supply voltage Vnn to the ground voltage Vss until the bit-line power-supply voltage Vbl and the cell-plate power-supply voltage Vcp rise to a fixed voltage. As a result, the sequence circuit 20 prevents the negative power-supply voltage Vnn from rising with voltage rise in the bit-line power-supply voltage Vbl and the cell-plate power-supply voltage Vcp, and, thus, can shorten a time taken for lowering the negative power-supply voltage Vnn to a fixed voltage. Accordingly, the sequence circuit 20 can shorten the start-up time of the power-supply circuit.

Figure 7:
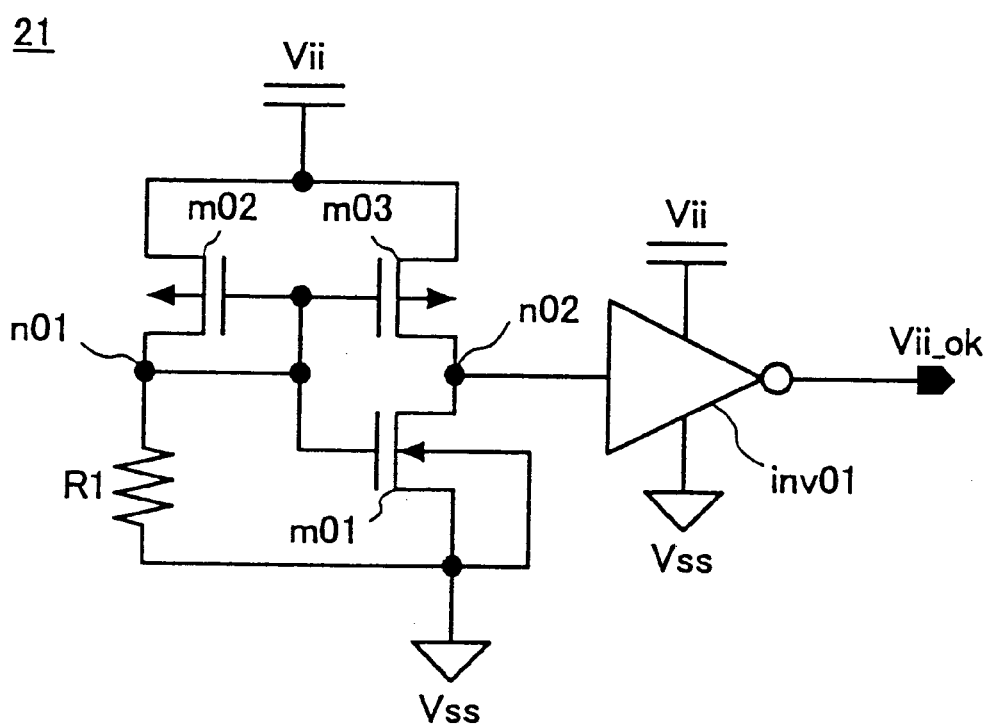
FIG. 7 is a circuit diagram showing an example of a structure of a Vii voltage-detecting unit.

FIG. 7 is a circuit diagram showing an example of a structure of the Vii voltage-detecting unit 21. The Vii voltage-detecting unit 21 shown in FIG. 21 includes an N-channel MOS (NMOS) transistor m01, P-channel MOS (PMOS) transistors m02 and m03, a resistor R1 and an inverter inv01.

If the internal step-down power-supply voltage Vii shown in FIG. 6A rises, a current starts flowing through the PMOS transistor m02 to the resistor R1, and a voltage at a node n01 rises according to a current flowing through the resistor R1. In detail, if the internal step-down power-supply voltage Vii rises to a fixed voltage, a voltage level at the node n01 becomes high.

Consequently, the NMOS transistor m01 whose gate terminal is connected to the node n01 is turned on. When the NMOS transistor m01 is turned on, a voltage level at a node n02 becomes low, and an output voltage level of the inverter inv01 becomes high, as shown in FIG. 6B.

As described above, the Vii voltage-detecting unit 21 detects the internal step-down power-supply voltage Vii, and can output the signal "Vii_ok" set high if the internal step-down power-supply voltage rises to the fixed voltage. It should be noted that another circuit can be substituted for the Vii voltage-detecting unit 21 if the circuit can detect the internal step-down power-supply voltage Vii.

Figure 8:
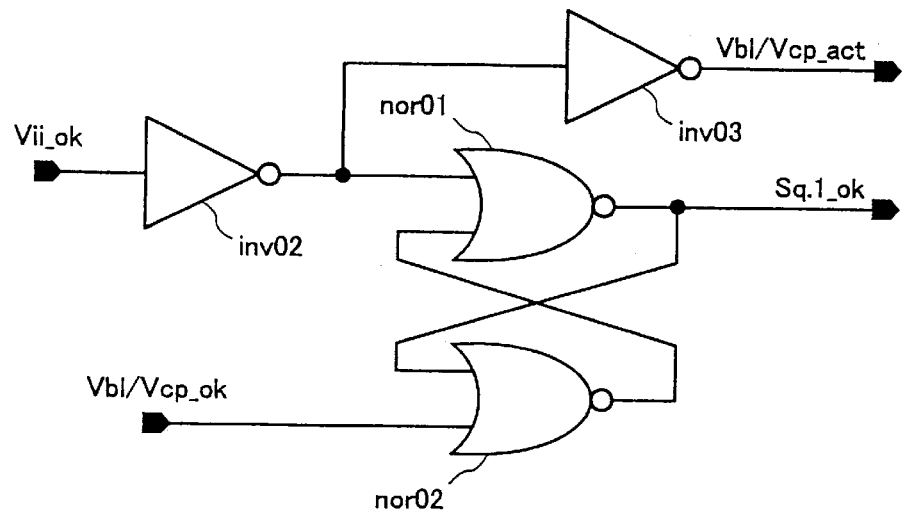
FIG. 8 is a circuit diagram showing an example of a structure of a sequencer.

FIG. 8 shows an example of a structure of a sequencer. The sequencer 26-1 shown in FIG. 8 includes inverters inv02 and inv03, and NOR circuits nor01 and nor02. If the signal "Vii_ok" set high as shown in FIG. 6B is supplied to the inverter inv02, an output voltage level of the inverter inv02 becomes low.

If the output voltage level of the inverter inv02 becomes low, the inverter inv03 can supply the signal "Vbl/Vcp_act" set high as shown in FIG. 6C to the Vbl/Vcp generating unit 22. After the signal "Vbl/Vcp_act" set high is supplied from the inverter inv03, the Vbl/Vcp generating unit 22 starts generating the bit-line power-supply voltage Vbl and the cell-plate power-supply voltage Vcp.

When the bit-line power-supply voltage Vbl and the cell-plate power-supply voltage Vcp rise to a fixed voltage, the Vbl/Vcp voltage-detecting unit 23 supplies the signal "Vbl/Vcp_ok" set high as shown in FIG. 6E to the NOR circuit nor02. Consequently, an output voltage level of the NOR circuit nor02 becomes low. The NOR circuit nor01 is supplied with a low-level signal from the inverter inv02 to one of its two input terminals, and a low-level signal from the NOR circuit nor02 to the other input terminal. Thus, the NOR circuit nor01 outputs the signal "Sq.1_ok" set high as shown in FIG. 6F. A description has been given of the structure of the sequencer 26-1. Sequencers other than the sequencer 26-1 can have the same structure as the sequencer 26-1.

As described above, the sequencer 26-1 can control a start-up order of a power-supply-voltage-generating unit such as the Vbl/Vcp generating unit 22, by supplying the signal "Sq.1_ok" to the following sequencer 26-2 after the bit-line power-supply voltage Vbl and the cell-plate power-supply voltage Vcp outputted from the Vbl/Vcp generating unit 22 rise to the fixed voltage.

Figure 9:
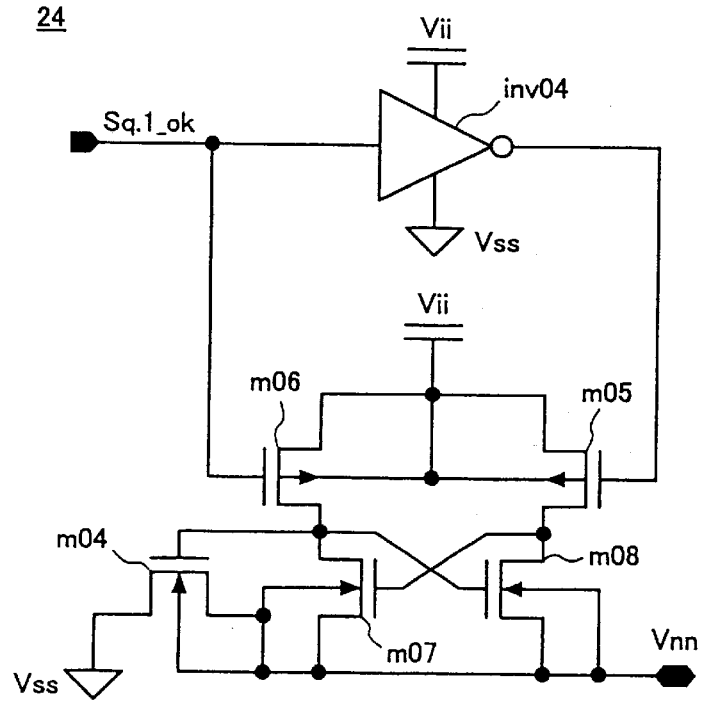
FIG. 9 is a circuit diagram showing an example of a structure of a Vnn clamp unit.

FIG. 9 shows an example of a structure of the Vnn clamp unit 24. The Vnn clamp unit 24 shown in FIG. 9 includes NMOS transistors m04, m07 and m08, PMOS transistors m05 and m06, and an inverter inv04. In a case in which a voltage level of the signal "Sq.1_ok" is low, the NMOS transistors m04 and m08, and the PMOS transistor m06 are turned on. On the other hand, the NMOS transistor m07 and the PMOS transistor m05 are turned off. Thus, in the case in which the voltage level of the signal "Sq.1_ok" is low, the negative power-supply voltage Vnn and the ground voltage Vss are connected with low resistance, and the negative power-supply voltage Vnn is clamped to the ground voltage Vss.

On the other hand, in a case in which the voltage level of the signal "Sq.1_ok" shown in FIG. 6F is high, the NMOS transistors m04 and m08, and the PMOS transistor m06 are turned off. In addition, the NMOS transistor m07 and the PMOS transistor m05 are turned on. Thus, in the case in which the voltage level of the signal "Sq.1_ok" is high, a state in which the negative power-supply voltage Vnn and the ground voltage Vss are connected with the low resistance is canceled. Consequently, the negative power-supply voltage Vnn is no more clamped.

As described above, the Vnn clamp unit 24 can clamp the negative power-supply voltage Vnn to the ground voltage Vss until the bit-line power-supply voltage Vbl and the cell-plate power-supply voltage Vcp rise to a fixed voltage, and can prevent the negative power-supply voltage Vnn from rising in accordance with voltage rise of the bit-line power-supply voltage Vbl and the cell-plate power-supply voltage Vcp.

Figure 10:
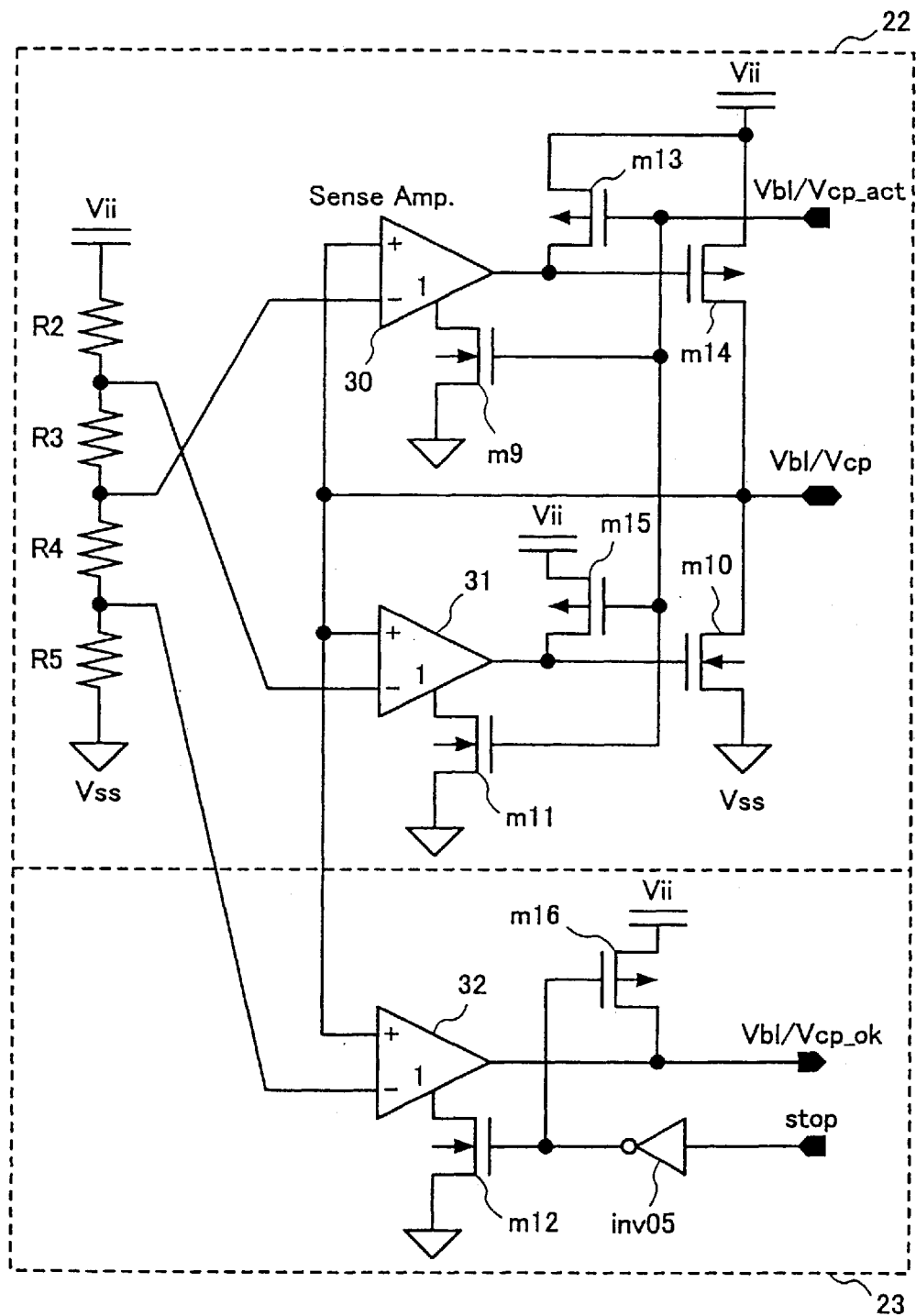
FIG. 10 is an example of structures of a Vbl/Vcp generating unit and a Vbl/Vcp voltage-detecting unit.

FIG. 10 shows an example of structures of the Vbl/Vcp generating unit 22 and the Vbl/Vcp voltage-detecting unit 23. The Vbl/Vcp generating unit 22 shown in FIG. 10 includes NMOS transistors m9, m10 and m11, PMOS transistors m13, m14 and m15, sense amplifiers 30 and 31, and resistors R2, R3, R4 and R5. Additionally, the Vbl/Vcp voltage-detecting unit 23 includes an NMOS transistor m12, a PMOS transistor m16, an inverter inv05 and a sense amplifier 32.

It should be noted that the Vbl/Vcp generating unit 22 and the Vbl/Vcp voltage-detecting unit 23 can be combined together. Additionally, the structure of the Vbl/Vcp generating unit 22 shown in FIG. 10 is a push-pull type. Alternatively, the Vbl/Vcp generating unit 22 can use another method of generating an intermediate voltage.

When the signal "Vbl/Vcp_act" set high as shown in FIG. 6C is supplied to the Vbl/vcp generating unit 22, the internal step-down power-supply voltage Vii has already been raised to a fixed voltage. Thus, voltages obtained by a resistance-voltage dividing method using the resistors R2 through R5 are being outputted. Additionally, if the signal "Vbl/Vcp_act" set high as shown in FIG. 6C is supplied to the Vbl/Vcp generating unit 22, the Vbl/Vcp generating unit 22 outputs the bit-line power-supply voltage Vbl and the cell-plate power-supply voltage Vcp in accordance with the voltages obtained by the resistance-voltage dividing method.

The Vbl/Vcp generating unit 22 compares the voltages obtained by the resistance-voltage dividing method, with the bit-line power-supply voltage Vbl and the cell-plate power-supply voltage Vcp, by using the sense amplifier 32. In a case in which the bit-line power-supply voltage Vbl and the cell-plate power-supply voltage Vcp become higher than a fixed voltage, the Vbl/Vcp generating unit 22 can output the signal "Vbl/Vcp_ok" set high as shown in FIG. 6E. In a case in which the Vbl/Vcp voltage-detecting unit 23 is composed of a Vbl voltage-detecting unit and a Vcp voltage-detecting unit, the Vbl/Vcp voltage-detecting unit 23 can take logical multiplication of a signal "Vbl_ok" and a signal "Vcp_ok"

If the signal "stop" set high as shown in FIG. 6K is supplied to the inverter inv05 of the Vbl/Vcp voltage-detecting unit 23, the PMOS transistor m16 is turned on, and the NMOS transistor m12 is turned off. Consequently, the signal "Vbl/Vcp_ok" is fixed at a high level. In addition, the Vbl/Vcp voltage-detecting unit 23 can reduce electricity consumed by the sense amplifier 32, since the NMOS transistor m12 is connected to a current source of the sense amplifier 32.

Figure 11:
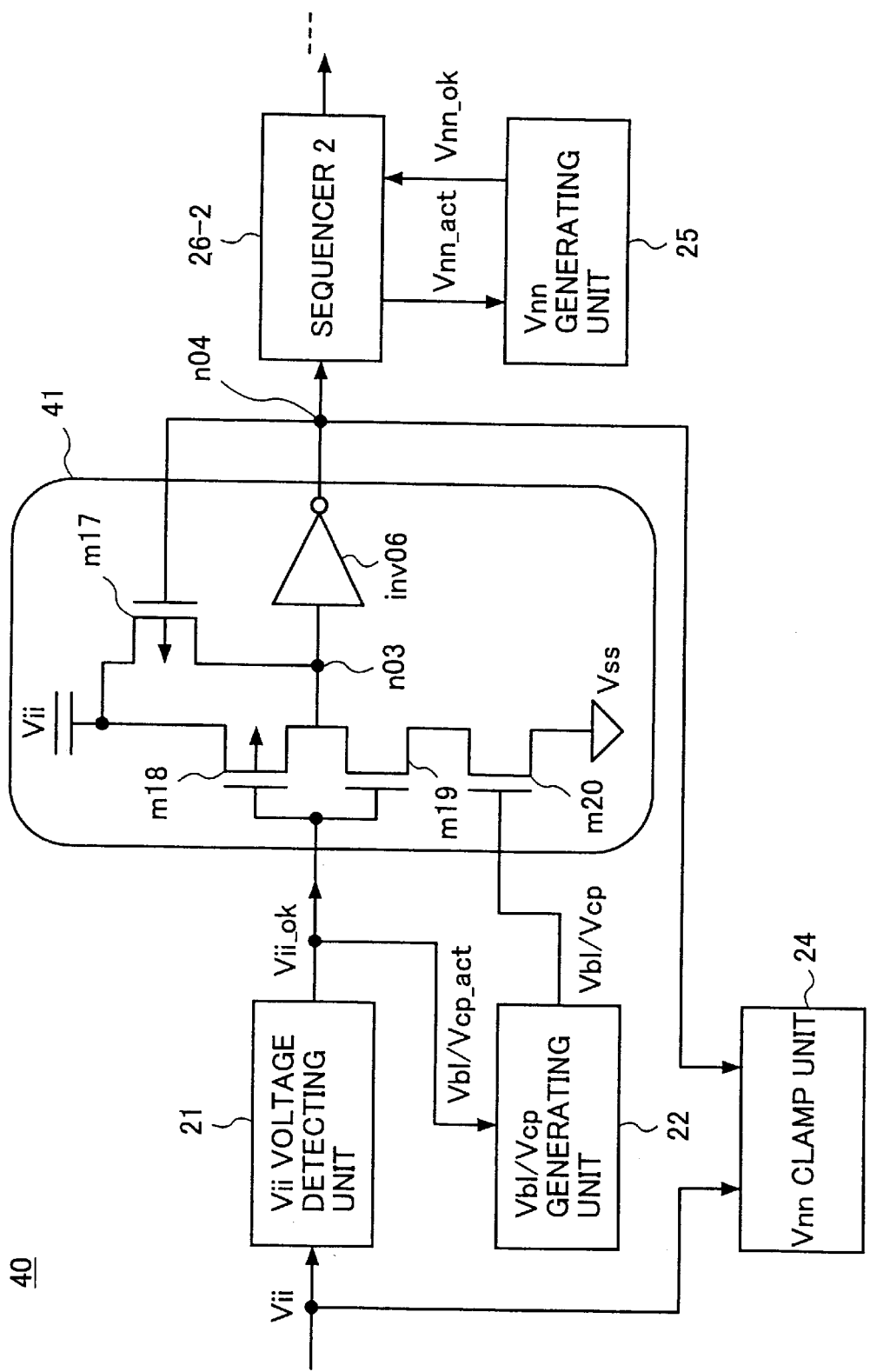
FIG. 11 is a block diagram showing a structure of a sequence circuit according to a second embodiment of the present invention.

FIG. 11 shows a sequence circuit according to a second embodiment of the present invention. The sequencer 26-1 and the Vbl/Vcp voltage-detecting unit 23 of the sequence circuit 20 shown in FIG. 5 are substituted with a monitoring unit 41 in a sequence circuit 40 shown in FIG. 11. A description will be mainly given of difference between the sequence circuit 20 shown in FIG. 5 and the sequence circuit 40 shown in FIG. 11, below.

The monitoring unit 41 shown in FIG. 11 includes PMOS transistors m17 and m18, NMOS transistors m19 and m20, and an inverter inv06. The PMOS transistor m18 and the NMOS transistor m19 included in the monitoring unit 41 are supplied with the signal "Vii_ok" shown in FIG. 6B from the Vii voltage-detecting unit 21. The NMOS transistor m20 included in the monitoring unit 41 is supplied with the bit-line power-supply voltage Vbl and the cell-plate power-supply voltage Vcp shown in FIG. 6D, from the Vbl/Vcp generating unit 22.

If the signal "Vii_ok" is low, the PMOS transistor m18 is turned on, and the NMOS transistor m19 is turned off. Consequently, a voltage level at a node n03 becomes high, and an output voltage level of the inverter inv06 becomes low. Thus, the signal "Sq.1_ok" supplied to the sequencer 26-2 remains low.

If the signal "Vii_ok" becomes high, the PMOS transistor m18 is turned off, and the NMOS transistor m19 is turned on. If the bit-line power-supply voltage Vbl and the cell-plate power-supply voltage Vcp rise to a fixed voltage, the NMOS transistor m20 is turned on. Consequently, the voltage level at the node n03 becomes low, and the output voltage level of the inverter inv06 becomes high.

As described above, the monitoring unit 41 has the same function as the sequencer 26-1 and the Vbl/Vcp voltage-detecting unit 23 shown in FIG. 5. It should be noted that the threshold voltage of the NMOS transistor m20 is lower than the bit-line power-supply voltage Vbl and the cell-plate power-supply voltage Vcp. The PMOS transistor m17 prevents a node n04 from being unstable.

Figure 12:
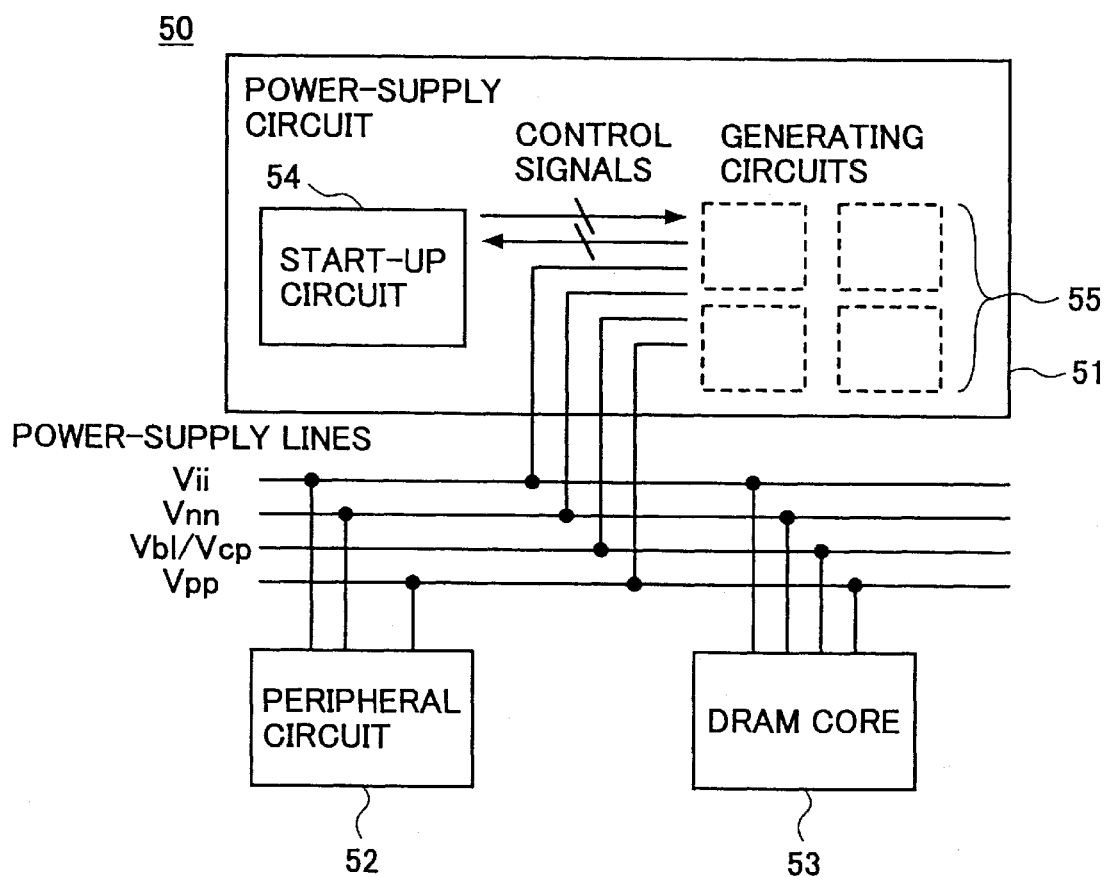
FIG. 12 is a semiconductor device employing the sequence circuit according to the present invention.

The above-described sequence circuits 20 and 40 can be utilized in a semiconductor device, as shown in FIG. 12, for instance. FIG. 12 shows a semiconductor device 50 employing the sequence circuit according to the present invention.

The semiconductor device 50 shown in FIG. 12 includes a power-supply circuit 51, a peripheral circuit 52 and a DRAM (Dynamic Random Access Memory) core 53. The power-supply circuit 51 includes a start-up circuit 54 and generating circuits 55. The semiconductor device 50 generates power sources such as the negative power-supply voltage Vnn, the bit-line power-supply voltage Vbl and the cell-plate power-supply voltage Vcp from the internal step-down power-supply voltage Vii by using the power-supply circuit 51, and uses the power sources. For example, the sequence circuit 20 or 40 according to the present invention is installed and used in the power-supply circuit 51.

The Vii voltage-detecting unit 21, the Vbl/Vcp voltage-detecting unit 23, the Vnn clamp unit 24 and the sequencer 26 can be included in the start-up circuit 54, for example. In addition, the Vbl/Vcp generating unit 22 and the Vnn generating unit 25 can be included in the generating units 55.

The sequencer 26-1 may have a structure that outputs the signal "Sq.1_ok" when either the bit-line power-supply voltage Vbl or the cell-plate power-supply voltage Vcp reaches its corresponding fixed level. It should be noted that the Vbl/Vcp voltage-detecting unit 23, the Vnn clamp unit 24 and the sequencer 26 correspond to a first circuit and a detection circuit, a second circuit, and a third circuit, respectively in claims.

According to the present invention, the sequence circuit 20 or 40 clamps a word line to a fixed voltage such as a ground-level voltage, and thus, can prevent a negative power-supply voltage used for resetting the word line from rising. Consequently, the sequence circuit can reduce consumed electricity.

The above description is provided in order to enable any person skilled in the art to make and use the invention and sets forth the best mode contemplated by the inventors of carrying out the invention.

The present invention is not limited to the specially disclosed embodiments and variations, and modifications may be made without departing from the scope and spirit of the invention.

The present application is based on Japanese Priority Application No. 2000-338068, filed on Nov. 6, 2000, the entire contents of which are hereby incorporated by reference.

What is claimed is:

1. A sequence circuit that controls a start-up order of a power-supply circuit, comprising:
    a first circuit that detects a first power-supply voltage charging a capacitor of a memory cell or a bit line;
    a second circuit that clamps a second power-supply voltage resetting a word line, to a first fixed voltage, until said first power-supply voltage reaches a second fixed voltage; and
    a third circuit that cancels clamping said second power-supply voltage after said first power-supply voltage reaches said second fixed voltage, and, then, generates said second power-supply voltage.

2. The sequence circuit as claimed in claim 1, wherein said third circuit deactivates said first circuit after said second power-supply voltage rises.

3. A semiconductor device, comprising:
    a word line that is reset to a negative voltage when said word line is unselected; and
    a sequence circuit that clamps said word line to a first fixed voltage until a fixed power-supply voltage supplied to a memory cell reaches a second fixed voltage, at a time of starting up power supply.

4. The semiconductor device as claimed in claim 3, wherein said sequence circuit resets said word line by starting up a circuit that generates said negative voltage, after said fixed power-supply voltage reaches said second fixed voltage.

5. The semiconductor device as claimed in claim 3, further comprising a detection circuit detecting said fixed power-supply voltage, wherein said sequence circuit deactivates said detection circuit after said fixed power-supply voltage reaches said second fixed voltage.

6. The semiconductor device as claimed in claim 3, wherein said fixed power-supply voltage includes a first power-supply voltage charging a capacitor of the memory cell and a second power-supply voltage charging a bit line connected to the memory cell.

7. The semiconductor device as claimed in claim 6, further comprising a detection circuit that detects said first power-supply voltage and said second power-supply voltage, wherein said sequence circuit resets said word line by starting up a circuit that generates said negative voltage, after either said first power-supply voltage or said second power-supply voltage reaches its corresponding fixed voltage.

* * * * *